United States Patent
Chao et al.

(10) Patent No.: US 6,391,759 B1
(45) Date of Patent: May 21, 2002

(54) BONDING METHOD WHICH PREVENTS WIRE SWEEP AND THE WIRE STRUCTURE THEREOF

(75) Inventors: Te-Tsung Chao; Hui-Chin Fang, both of Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/558,836

(22) Filed: Apr. 27, 2000

(51) Int. Cl.[7] .............................................. H01L 21/44
(52) U.S. Cl. .................................... 438/617; 228/180.5
(58) Field of Search ........................ 228/180.5; 438/617

(56) References Cited

U.S. PATENT DOCUMENTS

| | | | | |
|---|---|---|---|---|
| 4,932,584 A | * | 6/1990 | Yamazaki et al. | 228/180.5 |
| 5,111,989 A | * | 5/1992 | Holdgrafer et al. | 228/110.1 |
| 5,156,323 A | * | 10/1992 | Kumazawa et al. | 228/180.5 |
| 5,176,311 A | * | 1/1993 | Levine et al. | 228/180.5 |
| 5,259,548 A | * | 11/1993 | Yamazaki et al. | 228/180.5 |
| RE35,496 E | * | 4/1997 | Yamamura et al. | 174/52.4 |
| 5,961,029 A | * | 10/1999 | Nishiura et al. | 228/180.5 |
| 5,967,401 A | * | 10/1999 | Nishiura et al. | 228/180.5 |
| 5,989,995 A | * | 11/1999 | Nishiura et al. | 438/617 |
| 6,036,080 A | * | 3/2000 | Takahashi et al. | 228/180.5 |
| 6,112,974 A | * | 9/2000 | Nishiura et al. | 228/180.5 |
| 6,119,926 A | * | 9/2000 | Egger et al. | 228/180.5 |
| 6,161,753 A | * | 12/2000 | Tsai et al. | 228/180.5 |
| 6,176,416 B1 | * | 1/2001 | Tsai et al. | 228/180.5 |

FOREIGN PATENT DOCUMENTS

TW                246245           4/1995

* cited by examiner

*Primary Examiner*—Charles Bowers
*Assistant Examiner*—Asok Kumar Sarkar
(74) *Attorney, Agent, or Firm*—Bacon & Thomas

(57) ABSTRACT

A bonding method which prevents wire sweep and the wire structure thereof mainly provide the pre-shifted wire between the first bonding point and the second bonding point and counter to the mold flow from the side thus intensifying the strength of the wire structure and increasing the deformation space of the wire sustaining mold flow.

5 Claims, 9 Drawing Sheets

BONDING METHOD WHICH PREVENTS WIRE SWEEP AND THE WIRE STRUCTURE THEREOF

BACKGROUND OF THE INVENTION

1. Field of the Invention

The present invention is related to a bonding method which prevents wire sweep and the wire structure thereof and more particularly to the wire between the first bonding point and the second bonding point being shifted sideward to increase the intensity of the structure of the wire against the stress of the molding flood and the shift space of the wire caused by the molding flood.

2. Description of the Related Art

The conventional method of wire bonding, as shown in FIG. 1, a semiconductor device 100 having a plurality of wires 110, which connect eh first bonding pad 120 (on the chip 101) and a second bonding pad 130 (on the inner lead) to form a closed loop. The wire 110 extends upward from the first bonding pad 120 and downward to a second bonding pad 130 by bending so that the wire 110 has a high profile between the first bonding pad 120 and the second bonding pad 130. Because the high profile is mechanically supported only at the point of the bonding pad, therefore the high profile can easily be shifted by the stress of the molding flow that causes the wire to short. When the semiconductor device 100 is in the molding process, the liquified encapsulating material pushes the wires 110 the wires 110 are then shifted at a corner of the chip in an area of low wore arrangement density of the device 100 resulting wire sweeping occurs. Referring to FIG. 2, the bonding pads are arranged very close to one another at the corner of the chip resulting in a high wire arrangement density of wires 110. When the wires 110 undergo the molding flow from the molding process, wire sweeping occurs. However, it is difficult to overcome the occurrence of wire sweep by means of increasing the distance between two wires 110 because due to the requirement of small current, thus the dimension of the chip is small. Therefore, limited surface areas of the chip are provided for wire bonding. As shown in FIG. 3, when the device is in the molding process (referring to a direction shown by an arrow in FIG. 3), the corner of the chip 101 has a high wire arrangement density, which results in a deformation of wire 110 which is pushed by the molding flow. When a bending angle of the deformed wires 110 is large enough, the deformed wires 110 will come into contact with nearby wire 110 resulting in wire sweeping.

In order to overcome the above-mentioned wire sweep problem, R.O.C. Pat. Publication No. 246,245, Utility Model published on Apr. 21, 1995, discloses a structure entitled "Dual Wire Structure of the Semiconductor Package". As shown in FIGS. 4 and 5, the distance between two pads of the chip 200 is 4 mil or less. When molding, two or more wires 210 are juxtaposed in this area to overcome wire sweep which can be easily caused wire shift during mold flow. This method provides an auxiliary wire against the mold flow to prevent the deformation of the wire 210 and thus prevent the wire contact problem. Therefore, Publication No. 246,245 provides double wires 210 connecting the first bonding pad 220 to the second bonding pad 230 at the corner of the chip 200 (where molding flow is maximum).

Publication No. 246,245 overcomes the wire sweep problem by means of one or more auxiliary wires juxtaposed against the mold flow. Even if the auxiliary wire, the open loop, is shifted by mold flow and makes contact with another wire, the device does not experience wire short. However, adding the auxiliary wire has two main flaws: one, it reduces the applicable surface area of the chip for the wire bonding process; two, it increases the cost and manufacturing time of products.

The present invention intends to provide a bonding method which pre-shifts the wire from the reference line of connection between the first bonding pad and the second bonding pad in a direction counter to the mold flow to increase the strength of wire structure and to form the deformation space for wire shift, thus decreasing the occurrence of wire sweep. The present invention, which utilizes the pre-shifted wire, reduces the addition of the auxiliary wire of Pat. Publication No. 246,245 in such a way as to mitigate and overcome the above problem.

DESCRIPTION OF THE PREFERRED EMBODIMENTS

The primary objective of this invention is to provide a bonding method and the wire structure thereof in which the wire between the first bonding point and the second bonding point is bent to shift aside and counter the mold flow and form a deformation space for the wire to reduce the occurrence of wire sweep.

The present invention is a bonding method that prevents wire sweep. The present invention mainly provides a pre-shifted wire between the first bonding point and the second bonding point, which is counter to a mold flow from the side. This bonding method of the present invention intensifies the strength of the wire structure and increases the deformation space of the wire sustaining mold flow. The techniques of the present invention will be disclosed in a preferred embodiment and incorporated with other ordinary skill in the art.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The term "shift", as used herein, means the wire bonding between the first bonding point and the second bonding point by means of the capillary moving traversely on the reference line of connection the first bonding pad and the second bonding pad, where each distance of the wire is inclined at an appropriate angle to the vertical surface of the reference surface (which is formed by the first bonding point and the second bonding point).

The present invention is a bonding method which prevents wire sweep. The present invention mainly provides a pre-shifted wire between the first bonding point and the second bonding point which is counter to the mold flow from the side. This intensifies the strength of the wire structure and increases the deformation space of the wire sustaining mold flow. The present invention, the above-mentioned technology, will be described in a preferred embodiment and incorporated with other ordinary skill in the art.

Figure 6:
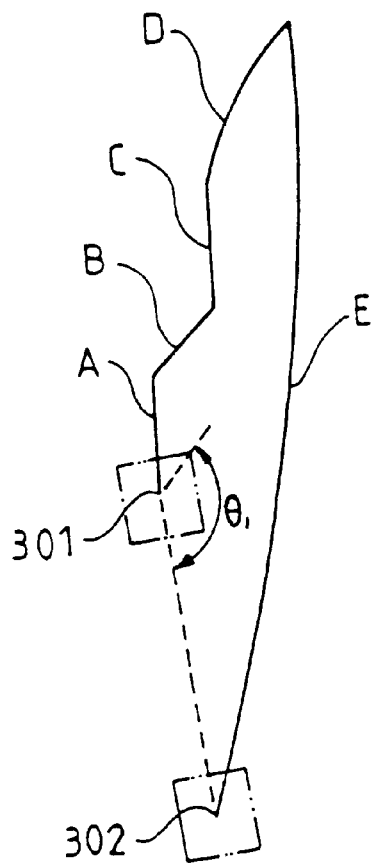
FIG. 6 is a perspective view of the wire bonding method in accordance with the present invention.
Figure 7:
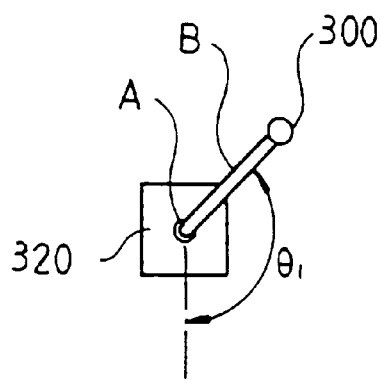
FIG. 7 is a top view of the path B of the wire bonding method in accordance with the present invention.
Figure 8:
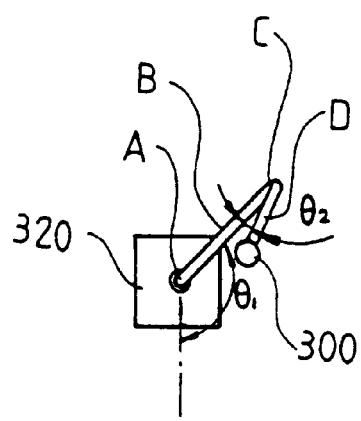
FIG. 8 is a top view of the path D of the wire bonding method in accordance with the present invention.

Referring to FIG. 6, the preventable wire sweep bonding method in accordance with the present invention defines a path for predetermined movement of the capillary. The capillary rises from the first bonding point in vertical direction along a path A. The capillary then moves horizontally away from both the first bonding point and the second bonding point along a path B; the capillary has shifted from the reference line of connection between the first bonding point and the second bonding point, between the shadow of the wire on the surface (defined by the first bonding point and the second bonding point) and the reference line is an angle $\theta_1$, preferably 135 degree (see FIG. 7, the top view between the path B and the reference line appear about 135 degrees). The capillary rises in a vertical direction along a path C, the capillary then moves in an inclined direction toward the second boiling point along a path D angled $\theta_2$ to the path B. As shown in FIG. 8, $\theta_2$ preferably equals $180-\theta_1$. The capillary moves along a path E. The shadows of paths A, B, C, D and E are substantially shifted from the reference line between the first bonding point and the second bonding point. The preferred embodiment of the preventable wire sweep bonding method in accordance with the present invention is that path A is equal to the path B.

Figure 9:
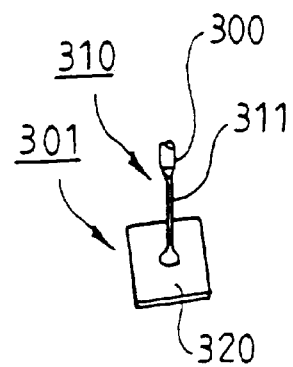
FIG. 9 is a perspective view of the first step of the wire bonding method in accordance with the present invention.

Referring to FIG. 9, the embodiment of the bonding method in accordance with the present invention utilizes a capillary 300 bonded to the end of the wire 310 which is bonded to the bonding pad 320 at the first bonding point 301. The capillary 300 rises along the path A, as shown in FIG. 6, to form a first length 311 of the wire 310.

Figure 10:
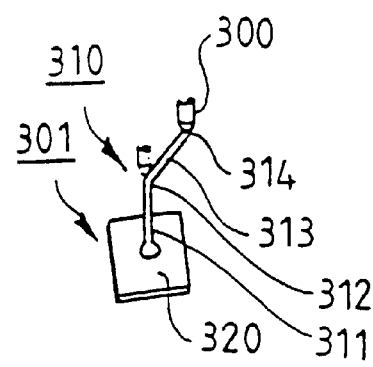
FIG. 10 is a perspective view of the first step of the wire bonding method in accordance with the present invention.

Referring to FIG. 10, the capillary 300 moves sideways to the first bonding pad 320 and opposite to the second bonding pad (not shown) a second length 313 in horizontal direction. So the wire 310 forms a first bent point 312 and a second bent point 314 at either of the two ends of the second length 313. The wire 310 will be bent at the two bent points for deformation while being pulled by the capillary 300. At that time, because the capillary 300 moved along the path B, as shown in FIG. 6, the wire 310 will be shifted from the reference line of connection between the first bonding pad 320 and the second bonding pad.

Figure 11:
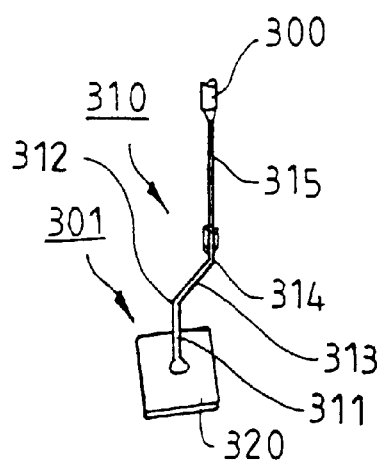
FIG. 11 is a perspective view of the second step of the wire bonding method in accordance with the present invention.

Referring to FIG. 11, the capillary 300 rises to form a third length 315 of the wire 310. Because the capillary 300 moved along the path C, as shown in FIG. 6, the second bent point 314 was formed between the second length 313 and the third length 315. At that time, the wire 310 consisted of the first distance 311, the first bent point 312, the second distance 313, the second bent point 314 and the third distance 315.

Figure 12:
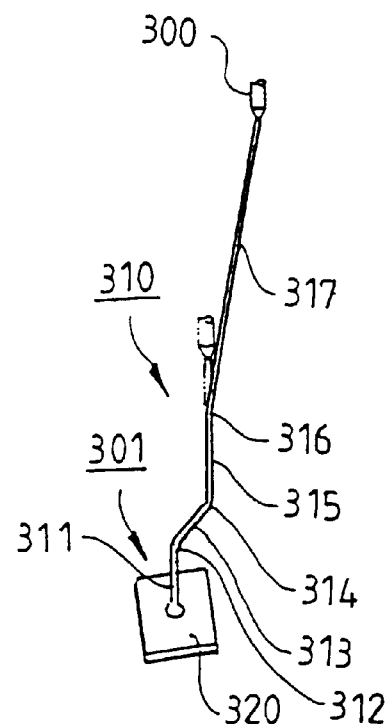
FIG. 12 is a perspective view of the third step of the wire bonding method in accordance with the present invention.

Referring to FIG. 12, the capillary 300 bent the wire 310 toward the second bonding pad (not shown) to form a third bent point 316. The wire 310 will be bent at the bent points for deformation while being pulled by the capillary 300. The capillary 300 moved along the path D, as shown in FIG. 6, and the wire 310 was extended in an inclined direction to form a predetermined length which is an amount sufficient for connecting wire 310 to the second bonding pad. At that time, the third bent point 316 was formed between the third length 315 and the fourth length 317. Therefore, the wire 310 consists of the first distance 311, the first bent point 312, the second distance 313, the second bent point 314, the third distance 315, the third bent point 316 and the fourth distance 317.

Figure 13:
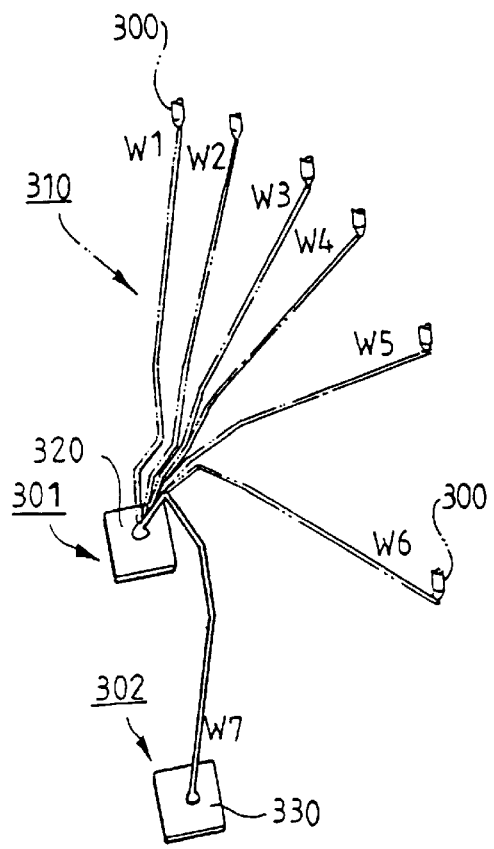
FIG. 13 is a perspective view of the fourth step of the wire bonding method in accordance with the present invention.

Referring to FIG. 13, the capillary 300 bonded the wire 310 to the second bonding pad 330 of the second bonding point 302. The capillary 300 moved along the path E, as shown in FIG. 6, and the wire 310 was moved to the second bonding point 302 from a trace $W_1$ to a trace $W_7$ through traces $W_2$, $W_3$, $W_4$, $W_5$ and $W_6$.

Figure 14:
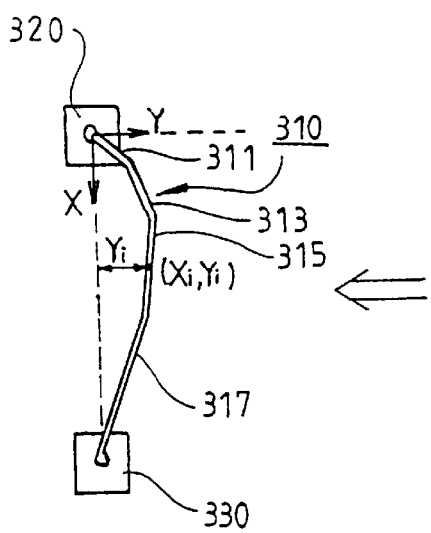
FIG. 14 is a top view of the wire structure in accordance with the embodiment of the present invention.

FIG. 14 illustrates the top view of the wire 310 connecting the first bonding pad 320 and the second bonding pad 330. The X-axis defines the reference line as well as the connection between the first bonding pad 320 and the second bonding pad 330. The lengths 311, 313, 315 and 317 of the wire 310 are shifted along the Y-axis which is perpendicular to the X-axis. When the points $(X_i, Y_i)$ of the wire 310 sustain mold flow along the Y-axis (see FIG. 14, as indicated by arrow), the structure of the wire 310 raises resistance in the Y-axis. As the resistance of wire structure increases, the total torque of the mold flow from the bonding points 301 and 302 to the points $(X_i, Y_i)$ of the wire 310 decreases such that the structure of the wire 310 can bear and support wider mold flow. In addition, because the points $(X_i, Y_i)$ of the wire 310 moved from the X-axis Y distance in the Y-axis, the shift increases the deformation of the points $(X_i, Y_i)$ caused by the mold flow. In the meantime, the shift points reduce the possibility of cross talk to another wire.

Figure 1:
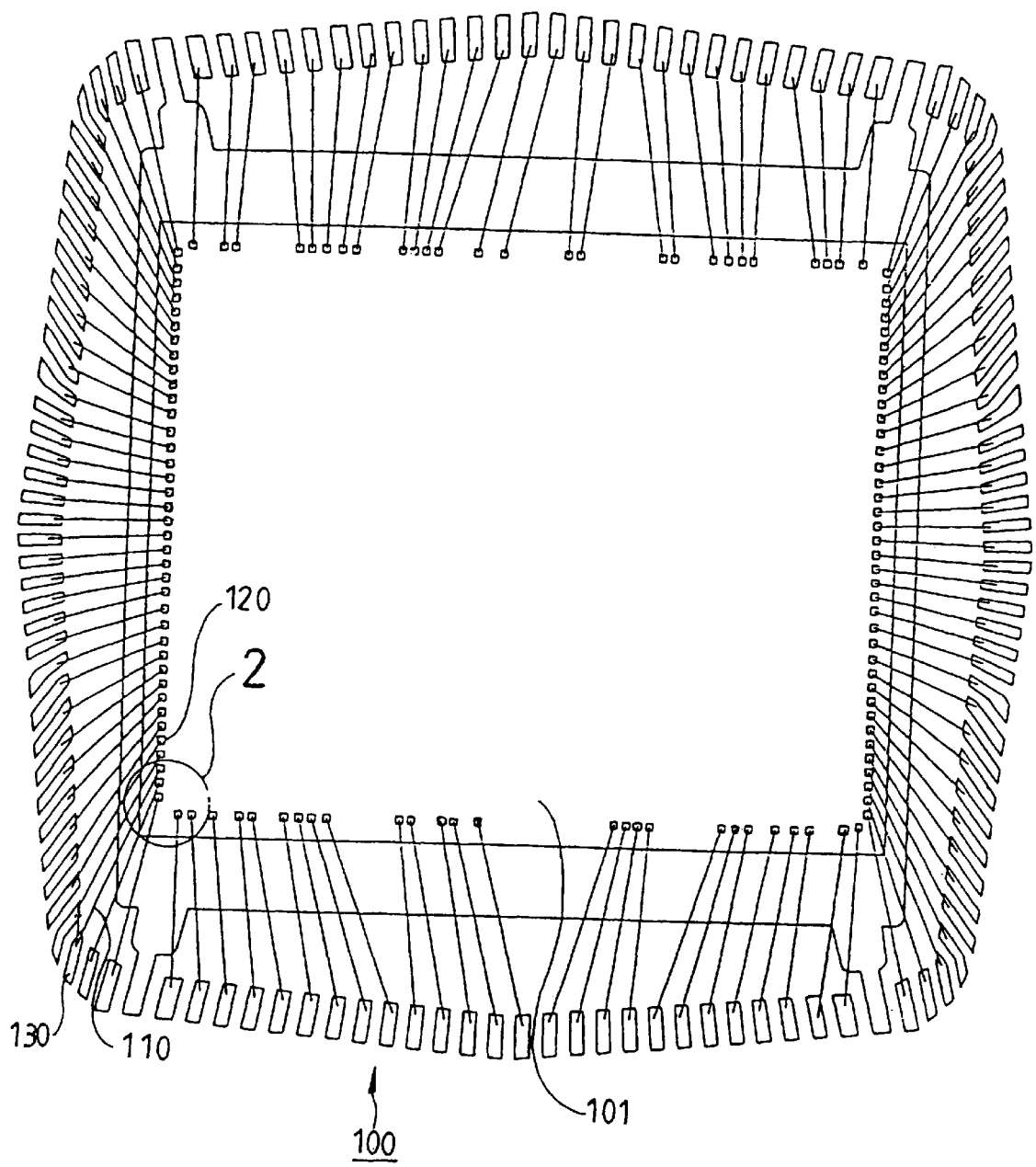
FIG. 1 is a top view of the semiconductor device and the inner wire arrangement thereof.

Referring to FIGS. 1 and 14, the embodiment of the present invention is applied to QFP type, as well as the chip 101 of the semiconductor device 100. At the corner of the chip 101 the wire 110 has three bent points 111 such that the wire 110 is shifted to the side of the first bonding pad 120 which corresponds to the second bonding point. This reduces the possibility of cross talk between the wires 110, as a larger deformation space between the two wires 110 is formed. Because the flood of the mold flow is usually greatest at the corner of the device 100, this necessitates arranging the wire 110 so that it has the intensified resistance and a larger deformation space to counter the flow. The wire bonding method in accordance with the present invention further includes a preferred shift measure which is greater than or equal to the distance between two first bonding pad 120 of the chip 101.

Figure 2:
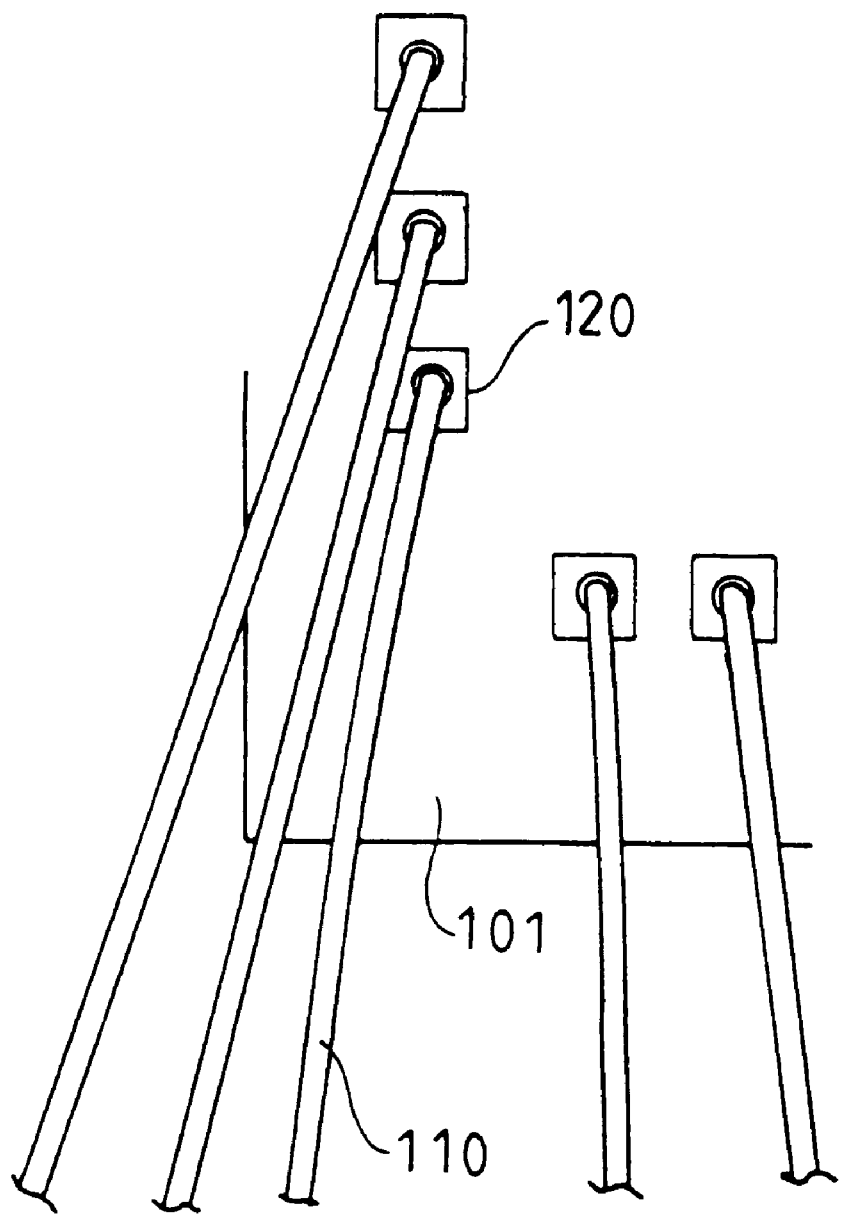
FIG. 2 is an enlarged view of FIG. 1 in accordance with the semiconductor device.
Figure 3:
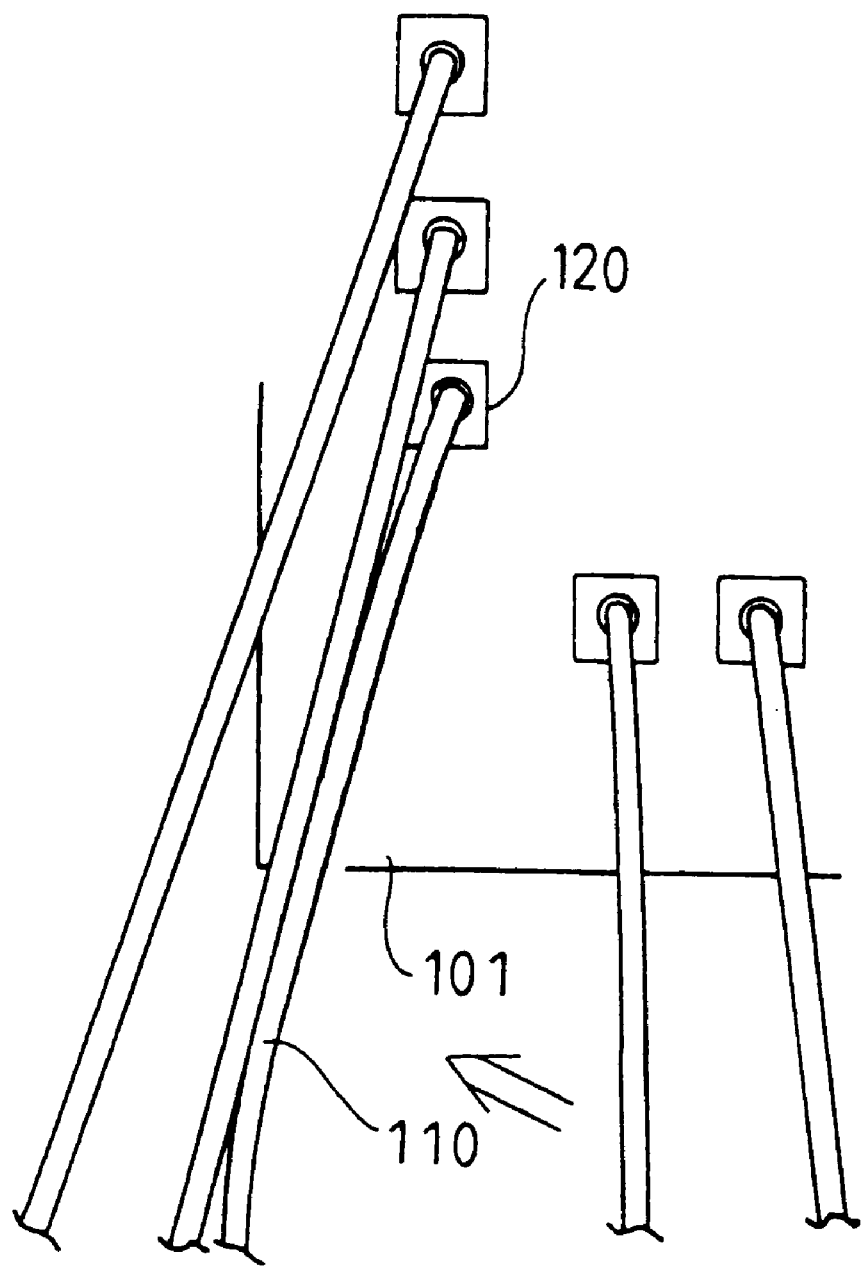
FIG. 3 is an enlarged view of the semiconductor device and demonstrates the occurrence of wire sweep in accordance with the convention.
Figure 4:
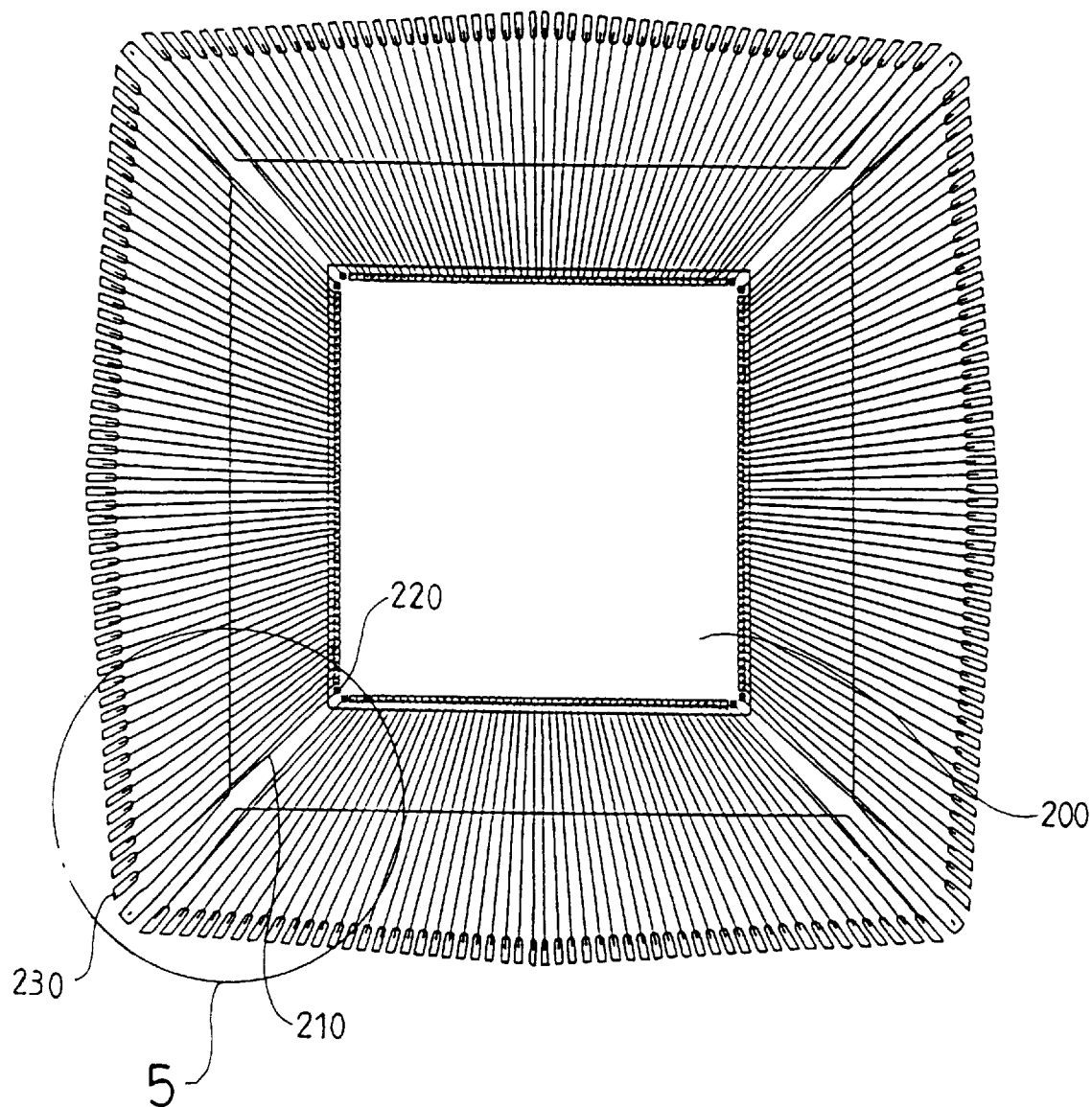
FIG. 4 is a top view of the dual wire structure in accordance with R.O.C. Pat. Publication No. 246,245.
Figure 5:
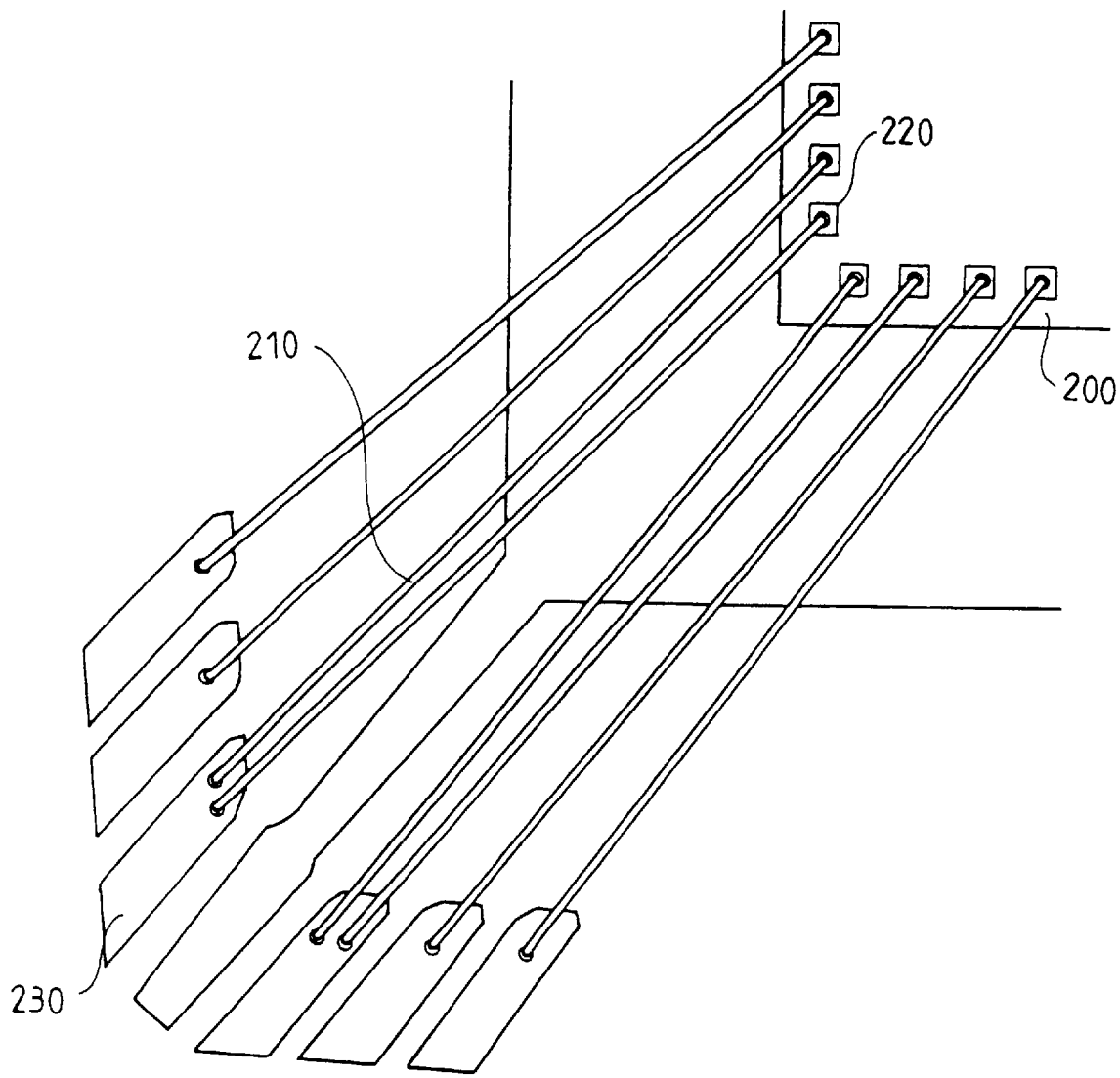
FIG. 5 is an enlarged view of FIG. 4 in accordance with R.O.C. Pat. Publication No. 246,245.

Referring to FIGS. 2 and 14, the wire 110 of the present invention, in contrast to the convention, has greater resistance counter to the mold flow and larger deformation space thereby reducing the possibility of wire sweep occurrence and increasing the reliability of wire bonding.

Figure 15:
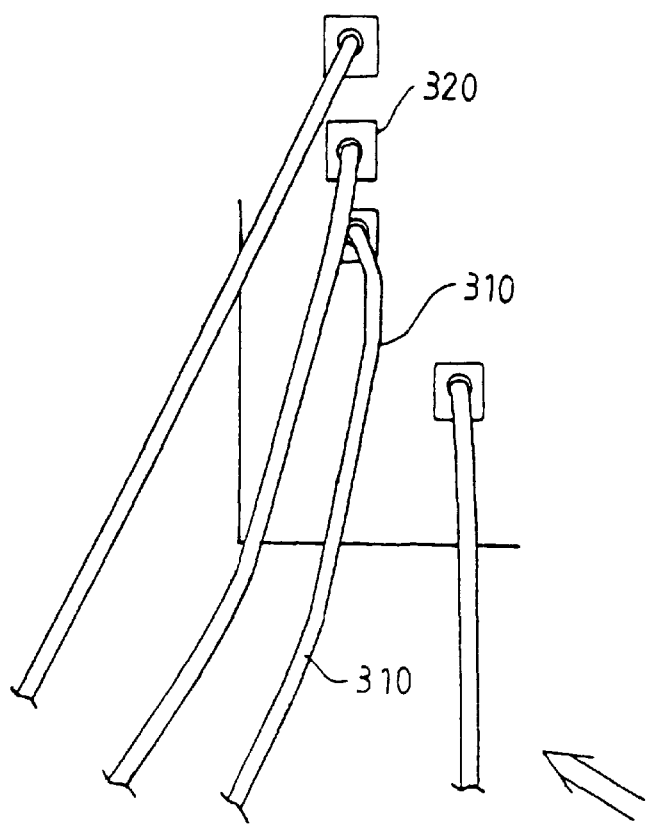
FIG. 15 is a top view of the wire bonding method applied in the semiconductor device in accordance with the embodiment of the present invention.
Figure 16:
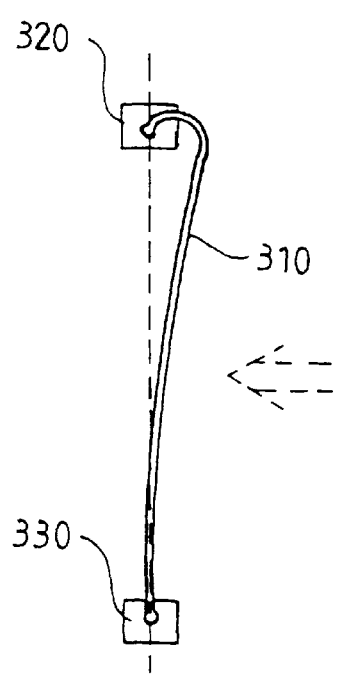
FIG. 16 is a top view of the wire structure before sustaining mold flow in accordance with the embodiment of the present invention.
Figure 17:
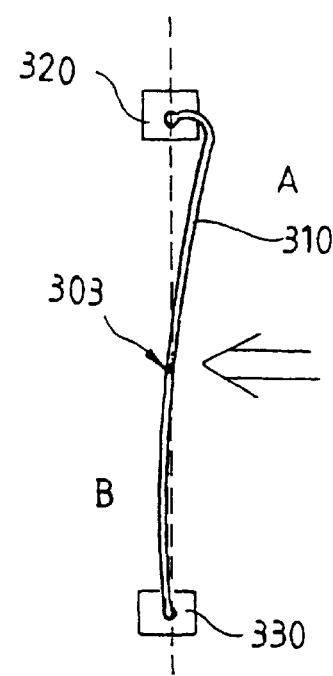
FIG. 17 is a top view of the wire structure after sustaining mold flow in accordance with the embodiment of the present invention.

FIGS. 15 and 16 illustrate the wire 310 connecting the first bonding pad 320 and the second bonding pad 330 before sustaining mold flow. During mold flow, the section of the wire 310 near the first bonding pad 320 is shifted to the side of the reference line connecting the first bonding pad 320 and the second bonding pad 330 to counter the mold flow (as shown by the arrow); the other section near the second bonding pad 330 approaches the reference line. FIG. 17 illustrates the shifted wire 310 connecting the first bonding pad 320 and the second bonding pad 330 after sustaining mold flow. According to the total torque of the mold flow and the resistance of the wire 310, the sections of the wire 310 near the bonding pads 320 and 330 are shifted less than the other section away from the bonding pads 320 and 330. The sections A and B, which approach the bonding pad 320 and 330, define the wire 310 which projects a shadow on the reference line to form a cross point 303. At the cross point 303, the sections A and B are located at either side of the reference line. As the wire 310 is shifted by the increasing mold flow, the cross point 303 is moved along the reference line from the second bonding pad 330 to the first bonding pad 320.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A bonding method which prevents wire sweep, comprising steps of:

connecting a wire to a first bonding point, moving a capillary straight up a first distance, moving the capillary a second distance away from a reference line of connection between the first bonding point and the second bonding point in horizontal direction thus making a first bent point and a second bonding point of the wire, again raising the capillary a third distance to extend the wire a predetermined length, whereas the first bent point is formed between the first distance and the second distance, and the second bent point is formed between the second distance and the third distance, and moving the capillary down to the second bonding point on which the wire will be bonded, wherein the wire connects the first bonding point to the second bonding point, and wherein the first distance, the first bent point, the second distance, the second bent point and the third distance of the wire are shifted to the side of the reference line thus increasing the resistance and the deformation space of the wire counter to the mold flow.

2. The preventable wire sweep bonding method as defined in claim 1, wherein the first distance is equal to the second distance.

3. The preventable wire sweep bonding method as defined in claim 1, wherein moving the capillary a second distance away from a reference line and opposite to the second bonding point in a horizontal direction makes a first bent point and a second bonding point of the wire.

4. The preventable wire sweep bonding method as defined in claim 1, wherein after raising the capillary a third distance, moving the capillary to the second bonding point to form the third bent point of the wire and then raising the capillary a fourth distance to extend the wire a predetermined length, and the first bent point is formed between the first distance and the second distance, the capillary is then moved down to the second bonding point on which the wire will be bonded.

5. The preventable wire sweep bonding method as defined in claim 1, wherein the shadow wire of the second distance projects on a surface which is defined by the first bonding point and the second bonding point and the angle between the shadow of the wire and the reference line is 135 degrees.

* * * * *